(12) United States Patent
Tsai et al.

(10) Patent No.: US 7,375,027 B2
(45) Date of Patent: May 20, 2008

(54) METHOD OF PROVIDING CONTACT VIA TO A SURFACE

(75) Inventors: Kuei-Chang Tsai, Cupertino, CA (US); Chunyuan Chao, Fremont, CA (US); Chia-Shun Hsiao, Hsin-Chu (TW)

(73) Assignee: ProMOS Technologies Inc., Hsin Chua (TW)

( * ) Notice: Subject to any disclaimer, the term of this patent is extended or adjusted under 35 U.S.C. 154(b) by 267 days.

(21) Appl. No.: 10/964,317

(22) Filed: Oct. 12, 2004

(65) Prior Publication Data

US 2006/0079080 A1    Apr. 13, 2006

(51) Int. Cl.
*H01L 21/4763* (2006.01)
(52) U.S. Cl. .................. 438/637; 438/638; 438/672
(58) Field of Classification Search ................ 438/618, 438/637, 638, 639, 640, 672, 673, 675
See application file for complete search history.

(56) References Cited

U.S. PATENT DOCUMENTS

| | | |
|---|---|---|
| 4,352,185 A | 9/1982 | Crane |
| 4,377,316 A | 3/1983 | Ecker et al. |
| 5,278,712 A | 1/1994 | Sugaya |
| 5,506,412 A | 4/1996 | Buttrill, Jr. |
| 5,631,179 A | 5/1997 | Sung et al. |
| 5,650,760 A | 7/1997 | Degun et al. |
| 5,676,587 A | 10/1997 | Landers et al. |
| 5,677,227 A | 10/1997 | Yang et al. |
| 5,792,689 A | 8/1998 | Yang et al. |
| 5,795,827 A | 8/1998 | Liaw et al. |
| 5,814,862 A | 9/1998 | Sung et al. |
| 5,831,276 A | 11/1998 | Gonzalez et al. |
| 5,837,577 A | 11/1998 | Cherng |
| 5,893,734 A | 4/1999 | Jeng et al. |
| 5,895,239 A | 4/1999 | Jeng et al. |
| 5,904,800 A | 5/1999 | Mautz |
| 5,915,170 A | 6/1999 | Raab et al. |
| 5,918,120 A | 6/1999 | Huang |
| 5,940,726 A | 8/1999 | Yu |
| 5,945,354 A | 8/1999 | Mautz |
| 5,972,765 A | 10/1999 | Clark et al. |
| 5,985,698 A | 11/1999 | Gonzalez et al. |
| 5,990,021 A | 11/1999 | Prall et al. |
| 6,001,717 A | 12/1999 | Lien |

(Continued)

FOREIGN PATENT DOCUMENTS

EP    0 294 864 A2    12/1988

(Continued)

*Primary Examiner*—Kevin M. Picardat
(74) *Attorney, Agent, or Firm*—MacPherson Kwok Chen & Heid LLP

(57) ABSTRACT

A contact via to a surface of a semiconductor material is provided, the contact via having a sidewall which is produced by anisotropically etching a dielectric layer which is placed on via openings. A protective layer is provided on the surface of the semiconductor material. To protect the substrate, an initial etch through an interlayer dielectric is performed to create an initial via which extends toward, but not into the substrate. At least a portion of the protective layer is retained on the substrate. In another step, the final contact via is created. During this step the protective layer is penetrated to open a via to the surface of the semiconductor material.

10 Claims, 3 Drawing Sheets

U.S. PATENT DOCUMENTS

| | | | |
|---|---|---|---|
| 6,063,548 | A | 5/2000 | Chu et al. |
| 6,093,611 | A | 7/2000 | Gardner et al. |
| 6,093,615 | A | 7/2000 | Schuele et al. |
| 6,100,569 | A | 8/2000 | Yeh |
| 6,118,135 | A | 9/2000 | Gonzalez et al. |
| 6,129,808 | A | 10/2000 | Wicker et al. |
| 6,136,643 | A | 10/2000 | Jeng et al. |
| 6,140,178 | A | 10/2000 | Tseng |
| 6,143,604 | A | 11/2000 | Chiang et al. |
| 6,150,213 | A | 11/2000 | Luo et al. |
| 6,168,984 | B1 | 1/2001 | Yoo et al. |
| 6,177,695 | B1 | 1/2001 | Jeng |
| 6,180,506 | B1 | 1/2001 | Sullivan |
| 6,197,628 | B1 | 3/2001 | Vaartstra et al. |
| 6,204,172 | B1 | 3/2001 | Marsh |
| 6,218,288 | B1 | 4/2001 | Li et al. |
| 6,228,765 | B1 | 5/2001 | Moussavi et al. |
| 6,228,771 | B1 | 5/2001 | Allers |
| 6,242,299 | B1 | 6/2001 | Hickert |
| 6,258,729 | B1 | 7/2001 | DeBoer et al. |
| 6,277,733 | B1 | 8/2001 | Smith |
| 6,281,072 | B1 | 8/2001 | Li et al. |
| 6,294,040 | B1 | 9/2001 | Raab et al. |
| 6,303,525 | B1 | 10/2001 | Annapragada |
| 6,306,759 | B1 | 10/2001 | Yen et al. |
| 6,323,081 | B1 | 11/2001 | Marsh |
| 6,342,446 | B1 | 1/2002 | Smith et al. |
| 6,350,646 | B1 | 2/2002 | Chen et al. |
| 6,380,628 | B2 | 4/2002 | Miller et al. |
| 6,394,026 | B1 | 5/2002 | Wicker et al. |
| 6,407,453 | B1 | 6/2002 | Watanabe et al. |
| 6,420,752 | B1 | 7/2002 | Ngo et al. |
| 6,429,449 | B1 | 8/2002 | Gonzalez et al. |
| 6,441,418 | B1 * | 8/2002 | Shields et al. .............. 257/296 |
| 6,461,367 | B1 | 10/2002 | Kirsch et al. |
| 6,461,909 | B1 | 10/2002 | Marsh et al. |
| 6,461,959 | B1 | 10/2002 | Chien et al. |
| 6,475,847 | B1 | 11/2002 | Ngo et al. |
| 6,486,015 | B1 | 11/2002 | Chaudhary et al. |
| 6,489,199 | B2 | 12/2002 | Li et al. |
| 6,495,417 | B1 | 12/2002 | Yang et al. |
| 6,525,419 | B1 | 2/2003 | Deeter et al. |
| 6,531,728 | B2 | 3/2003 | DeBoer et al. |
| 6,534,389 | B1 | 3/2003 | Ference et al. |
| 2002/0110980 | A1 | 8/2002 | Yang et al. |
| 2002/0179948 | A1 | 12/2002 | Lee |

FOREIGN PATENT DOCUMENTS

| | | |
|---|---|---|
| EP | 0 317 934 A1 | 5/1989 |
| EP | 0 599 506 A1 | 6/1994 |
| EP | 0 677 869 A1 | 10/1995 |
| EP | 0 999 592 A1 | 5/2000 |

* cited by examiner

METHOD OF PROVIDING CONTACT VIA TO A SURFACE

FIELD OF THE INVENTION

This invention relates generally to the field of manufacturing semiconductor devices and more particularly to opening a contact via to a surface of a material in a semiconductor device.

BACKGROUND OF THE INVENTION

In the manufacture of semiconductor devices, it is desirable to provide relatively small diameter openings to contact areas of the device. One limitation in doing this is the diameter of openings utilized in photomasks to expose areas of photoresist covering the materials to be etched. It is desirable to produce openings which are smaller than those otherwise available using the photomask along with a light exposing the photoresist. This has been achieved in a prior art by after exposing the photoresist with a photomask, etching a via down to the surface to be contacted. Next a liner material is applied to the via and the surface to be contacted. After deposition of the liner material, an anisotropic etch is performed. Because of the nature of anisotropic etching, the liner material at the bottom of the aperture is etched and removed, while a portion of the liner material is retained during this etch process. The surface to be contacted at the bottom of the via is thus etched once again, damaging the substrate material which will ultimately be contacted by an electrical connection.

Thus it will be appreciated that in the prior art technique, the first etch opens the via down to the surface to be contacted and this is followed by the application of the liner of material and subjecting the liner material to anisotropic etching. Using this prior art process results in a double etch of the material at the base of the opening, thus unnecessarily damaging that material in advance of providing a contact to the material at the base of the via.

Thus what is needed is a process by which only a single etch is utilized to open the contact area at the base of the via while concurrently establish a liner covering the interior walls of the via.

SUMMARY OF THE INVENTION

In accordance with the present invention, a method of providing a contact via to a surface of a material is provided which avoids the damaging effects which resulted in prior art techniques. In one aspect of the invention, a contact via to a surface of a material is performed by forming a first dielectric layer on the surface, forming a second dielectric layer on the first dielectric layer, providing a first aperture which extends from a surface of the second dielectric layer toward the contact surface area of the material for a distance which is less than a combined technique of the first and second dielectric layers. Next, a third dielectric layer is provided covering a surface of the aperture and an exposed surface of the first dielectric layer. A portion of the third dielectric layer and a portion of the first dielectric layer are removed to expose a portion of the contact surface area of the material.

In a further aspect of the present invention, forming a first dielectric layer on the surface comprises depositing a layer of silicon nitride on the surface.

In a further embodiment, forming a first dielectric layer on the surface comprises depositing a layer of silicon oxynitride on the surface.

In a further embodiment, the first dielectric layer is formed using a chemical vapor deposition process.

In a further embodiment, the first dielectric layer is formed by depositing a layer of silicon oxynitride using a chemical vapor deposition process.

In a further embodiment of the present invention, removal of a portion of the third dielectric layer and the first dielectric layer to expose a portion of the surface of the material is performed by an anisotropic etch process.

In a further aspect, the forming of a second dielectric layer on the first dielectric layer comprises forming a layer of silicon dioxide on the first dielectric layer.

In a further embodiment, providing a first aperture comprises performing an etch process. In a further embodiment, the etch processes performed using a reactive ion etching.

In a further aspect of the present invention, removing a portion of a third dielectric layer in the first dielectric layer comprises performing a reactive ion etch.

DETAILED DESCRIPTION OF THE EMBODIMENT(S)

Figure 1:
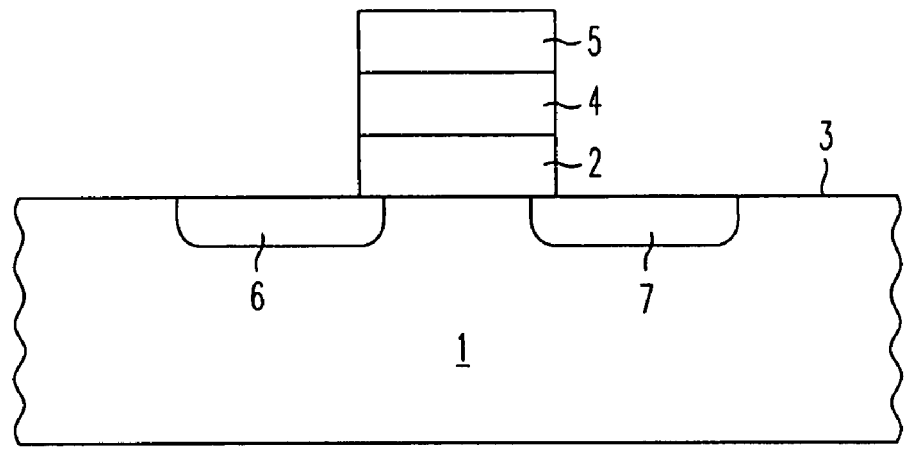
FIG. 1 illustrates a portion of a semiconductor substrate in a cross-sectional view, the substrate including source and drain regions, gate oxide, a gate and a protective layer.

Referring to FIG. 1, a portion of a semiconductor substrate 1 shown in cross-section. Substrate 1 includes a gate oxide 2 on the surface 3 of the substrate and a gate 4 positioned on top of gate oxide 2. Positioned on gate 4 is a protective layer 5, sometimes also referred to as gate nitride, which may be comprised of, for example, a layer of silicon nitride ($Si_3N_4$). Gate oxide 2 may be any of the oxides well known to those skilled in the art. Gate 4 may be comprised of, for example, of polycrystalline silicon. The structure illustrated in FIG. 1 can be formed by techniques well-known to those skilled in the art and accordingly does not require a description. Also shown in FIG. 1 is source region 6 and drain region 7 which are associated with gate 4. It is desirable to provide connections to the gate source and drain regions with minimal damage to them and the process for doing so is described herein.

Figure 2:
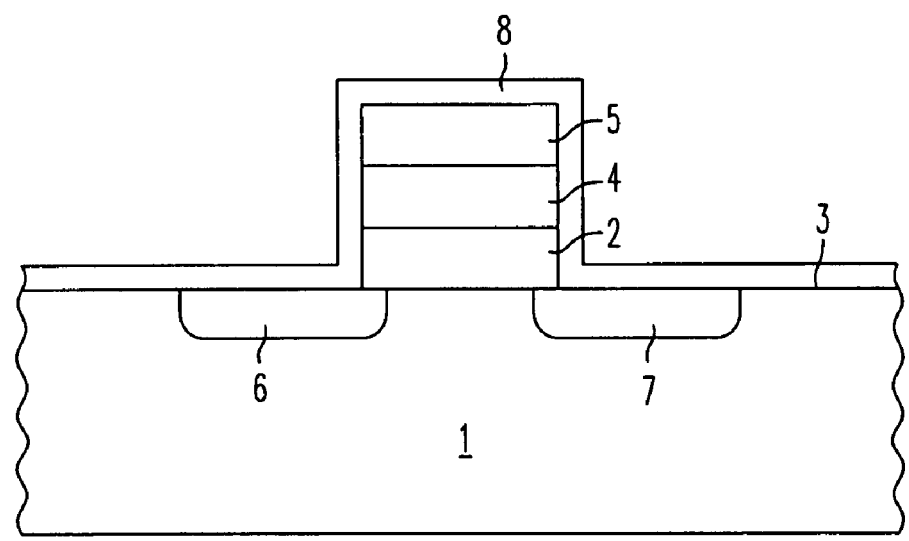
FIG. 2 illustrates a view of the structure of FIG. 1 in which a protective layer has been applied.

Referring to FIG. 2, a protective layer 8, also sometimes referred to as a barrier layer, is applied and covers surface 3 as well as the gate 4, protective layer 5 and gate oxide 2. Protective layer 8 may be composed of silicon nitride ($Si_3N_4$) or silicon oxynitride ($Si_3O_xN_y$). In the silicon oxynitride formula, x and y may each range from 0-2. Protective layer 8 may be applied by using the well-known techniques such as low pressure chemical vapor deposition (LPCVD) or plasma enhanced chemical vapor deposition (PECVD). Protective layer 8 may have various thicknesses, ranging from 20 Å to 500 Å in thickness. For example, it has been found that a thickness of about 230 Å is a desirable one to use.

Figure 3:
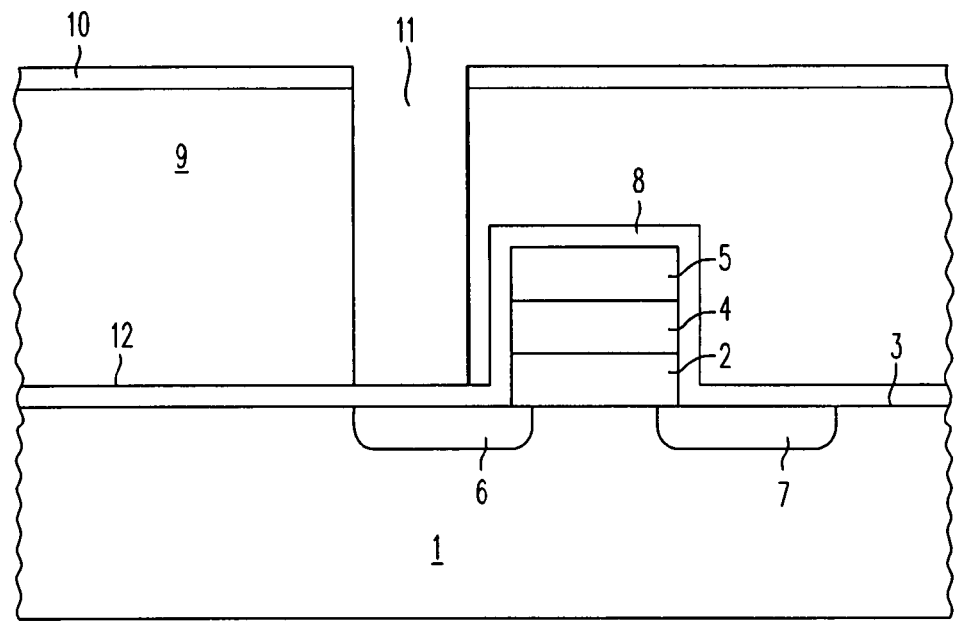
FIG. 3 illustrates in cross-section the structure of FIG. 2 in which a second dielectric layer is applied and a photoresist layer is applied with a resultant etching to the protective layer applied in FIG. 2.
Figure 4:
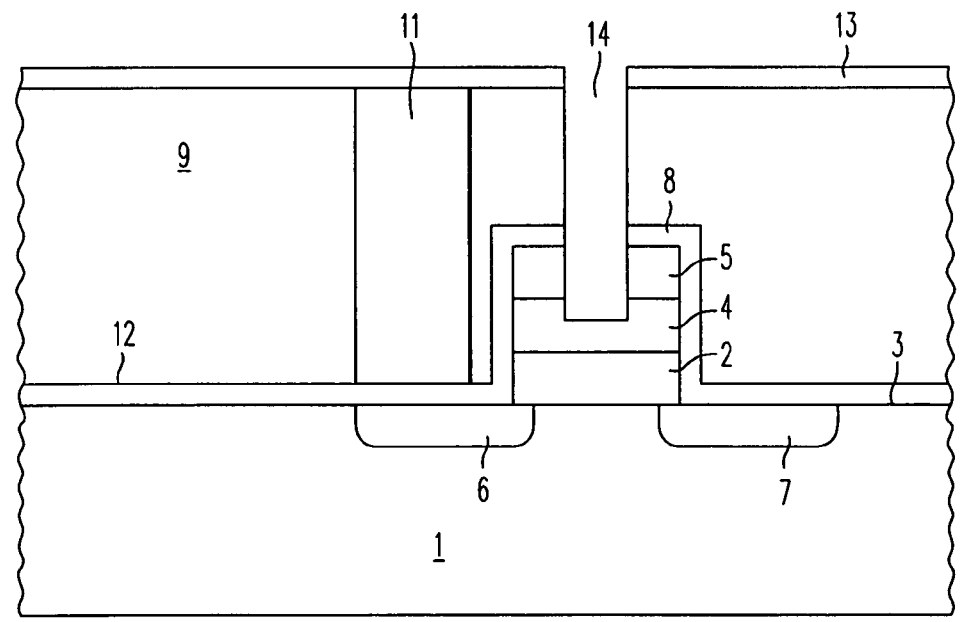
FIG. 4 illustrates a cross-sectional view in which a via opening is etched to the gate.

Turning to FIG. 3, a second dielectric layer 9 is applied over protective layer 8 and as further illustrated in FIG. 3 a layer of photoresist 10 is applied and exposed using a photomask to provide an opening which will ultimately be used to provide a via to source region 6. An initial via 11 is etched through a second dielectric layer 9 as illustrated in FIG. 3. The etching through dielectric layer 9 is stopped on surface 12 of protective layer 8. The etching of initial via 11 may be performed using conventional etching processes such as, for example, the reactive ion etching using a gas such as $C_4F_6/O_2/Ar$. As will be appreciated from reference to FIG. 3, the etching process which forms initial via 11 is stopped after reaching protective layer 8. Since it does not penetrate through the thickness of protective layer 8, this avoids any damage to substrate 1 in the region of the contact to be made to the source region 6. Second dielectric layer 9 provides insulation between active layers of the semiconductor structure, and is commonly referred to in the art as an interlayer dielectric. Second dielectric layer 9 may be made of various insulating materials such as, for example, silicon dioxide ($SiO_2$).

After completing the etching in FIG. 3, photoresist mask 10 is removed and replaced with photoresist layer 13 which is exposed to light and second dielectric layer 9 is etched to provide an initial opening 14 which extends down to gate 4. Etching of initial opening 14 may be performed using the same process described above with regard to providing initial via 11. After initial opening 14 which is opened through protective layer 8 and protective layer 5 (also sometimes referred to as a gate nitride), photoresist layer 13 is removed. For convenience of illustration, only initial via 11 is illustrated as the beginning point for providing an opening to source region 6, however a similar technique would be utilized to provide a via for drain region 7.

Figure 5:
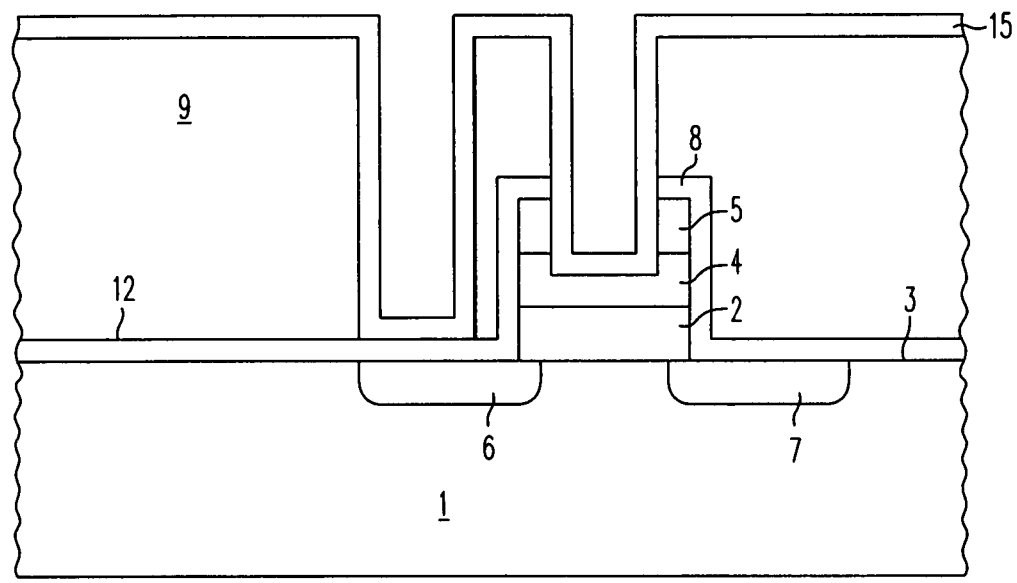
FIG. 5 is a cross-sectional view illustrating the step in which a third dielectric material is applied to first and second via openings.

Turning to FIG. 5, a third dielectric layer 15 is applied as an initial step of providing a liner for the via openings to source region 6 and gate 4. Third dielectric layer 15 may be, for example, silicon nitride ($Si_3N_4$) or silicon oxynitride ($Si_3O_xN_y$), where x and y may have the ranges as pointed out above with regard to protective layer 8. Third dielectric layer 15 may be applied, for example, through the use of LPCVD or PECVD techniques. A suitable range of thickness for dielectric layer 15 ranges from 20 Å to 500 Å. A typical thickness which has been found to be desirable is about 150 Å.

Figure 6:
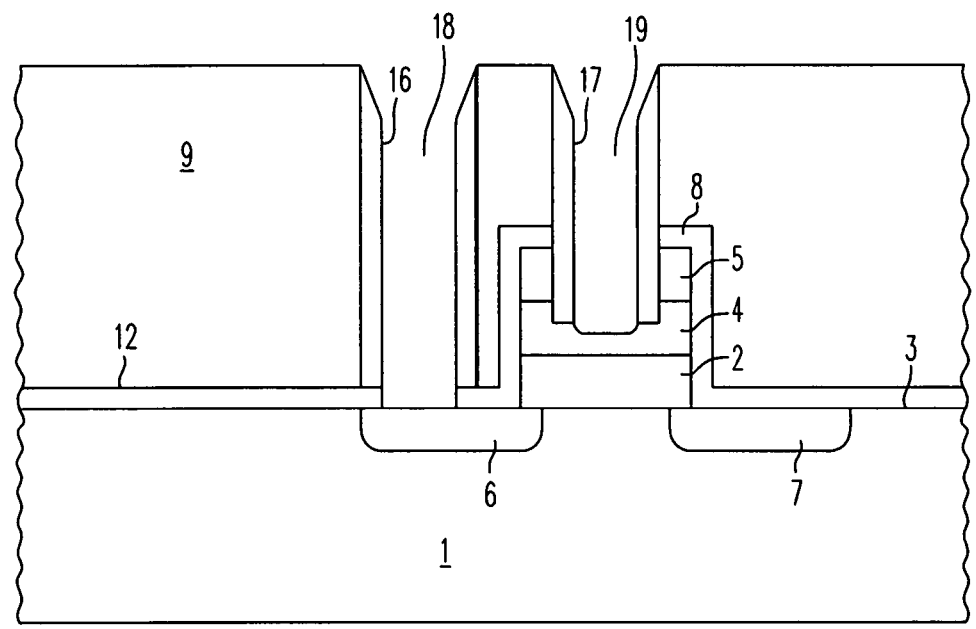
FIG. 6 is a cross-sectional view illustrating the structure resulting from an anisotropic etch of the structure shown in FIG. 5.

Turning to FIG. 6, an anisotropic etch is performed to remove the portions of third dielectric layer 15 which are on the surface of a second dielectric layer 9 and above the portion of protective layer 8 in the via leading to source region 6. It will also be appreciated from reference to FIG. 6 that the etching removes, in addition to third dielectric layer 15, the portion of protective layer 8 which is in the via above source region 6. The etchants and their formulation are shown below in Table 1. The etching is performed by well-known reactive ion etching techniques. As illustrated in Table 1, the etch ratio for two exemplary etching to compositions is illustrated. The reactive ion etching yields liner 16 and 17 which are included in the final vias 18 and 19 which lead to the source region and the gate respectively.

It will be appreciated that by using the above technique, only one etch into the substrate in the region of the source region 6 is required and thus the damage to the substrate is minimalized.

TABLE 1

|  | $CHF_3/Ar$ (NS) | | $CF_4/CHF_3/Ar$ | |
| --- | --- | --- | --- | --- |
|  | E/R | U % | E/R | U % |
| SiN E/R (A/min) | 1121 or higher | 3.65% | 1721.3 or higher | 11.90% |
| $SiO_2$ E/R (A/min) | 766 or higher | 5.24% | 1816.7 or higher | 5.26% |
| Si E/R (A/min) | 420 or higher | | 600 or higher | |
| SiN:$SiO_2$ Selectivity | 1.46 or lower | | 0.95 or lower | |
| SiN:Si Selectivity | 2.67 or higher | | 2.87 or higher | |

We claim:

1. A method of providing a contact via to a surface of a substrate, the method comprising:
    forming a first dielectric layer on the surface;
    forming a second dielectric layer on the first dielectric layer;
    providing a first aperture which extends from a surface of the second dielectric layer toward the surface of the substrate for a distance which is less than a combined thickness of the first and second dielectric layers;
    providing a third dielectric layer covering a surface of the first aperture and an exposed surface of the first dielectric layer; and
    removing a portion of the third dielectric layer and a portion of the first dielectric layer to expose a portion of the surface of the substrate.

2. The method according to claim 1, wherein forming a first dielectric layer on the surface comprises depositing a layer of silicon nitride on the surface.

3. The method according to claim 1, wherein forming a first dielectric layer on the surface comprises depositing a layer of silicon oxynitride on the surface.

4. The method according to claim 2, wherein depositing a layer of silicon nitride comprises depositing the layer of silicon nitride using a chemical vapor deposition process.

5. The method according to claim 3, wherein depositing a layer of silicon oxynitride comprises depositing the layer of silicon oxynitride using a chemical vapor deposition process.

6. The method according to claim 1, wherein removing a portion of the third dielectric layer and the first dielectric layer to expose a portion of the surface of the material comprises performing an anisotropic etch process.

7. The method according to claim 1, wherein forming a second dielectric layer on the first dielectric layer comprises forming a layer of silicon dioxide on the first dielectric layer.

8. The method according to claim 1, wherein providing the first aperture comprises performing an etch process.

9. The method according to claim 8, wherein performing an etch process comprises performing a reactive ion etch process.

10. The method according to claim 1, wherein removing a portion of the third dielectric layer and the first dielectric layer comprises performing a reactive ion etch.

* * * * *